(12) United States Patent
Koole et al.

(10) Patent No.: US 8,404,170 B2
(45) Date of Patent: Mar. 26, 2013

(54) IMPRINT LITHOGRAPHY APPARATUS AND METHOD

(75) Inventors: Roelof Koole, Eindhoven (NL); Sander Frederik Wuister, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 183 days.

(21) Appl. No.: 12/855,250

(22) Filed: Aug. 12, 2010

(65) Prior Publication Data

US 2011/0037201 A1 Feb. 17, 2011

Related U.S. Application Data

(60) Provisional application No. 61/233,992, filed on Aug. 14, 2009.

(51) Int. Cl.
*B29C 59/16* (2006.01)
*B29C 59/02* (2006.01)

(52) U.S. Cl. ........ 264/293; 264/447; 264/493; 264/159; 977/887

(58) Field of Classification Search .................. 264/447, 264/493; 977/887
See application file for complete search history.

(56) References Cited

U.S. PATENT DOCUMENTS

| 6,334,960 | B1 | 1/2002 | Willson et al. | |
| 2004/0105624 | A1* | 6/2004 | Lee et al. ......................... | 385/37 |
| 2004/0124566 | A1 | 7/2004 | Sreenivasan et al. | |
| 2005/0274693 | A1* | 12/2005 | Heidari et al. .................. | 216/52 |
| 2006/0021533 | A1 | 2/2006 | Jeans | |
| 2008/0018024 | A1 | 1/2008 | Kataho et al. | |
| 2008/0241418 | A1* | 10/2008 | Allen et al. .................... | 427/559 |

FOREIGN PATENT DOCUMENTS

| CN | 101073034 | 11/2007 |
| JP | 2002-093748 | 3/2002 |
| JP | 2005-533393 | 11/2005 |
| JP | 2005-349619 | 12/2005 |
| JP | 2008-155344 | 7/2008 |
| JP | 2008-270686 | 11/2008 |
| JP | 2009-190300 | 8/2009 |
| WO | 02/067055 A2 | 8/2002 |

OTHER PUBLICATIONS

Chinese Office Action dated Feb. 29, 2012 in corresponding Chinese Patent Application No. 201010253201.4.
Japanese Office Action mailed Mar. 16, 2012 in corresponding Japanese Patent Application No. 2010-176894.
Sander F. Wuister et al., "Squeeze time investigations for step and flash imprint lithography," Microelectronic Engineering 86 (Dec. 11, 2008) 681-683.

(Continued)

*Primary Examiner* — Yogendra Gupta
*Assistant Examiner* — Robert J Grun
(74) *Attorney, Agent, or Firm* — Pillsbury Winthrop Shaw Pittman LLP

(57) ABSTRACT

An imprint lithography method is disclosed for forming a patterned layer from a UV-curable, imprintable liquid medium on a substrate by means of an imprint template with a patterned surface. The method involves bringing together the patterned surface and the UV-curable medium for a filling period, illuminating the UV-curable medium with UV-radiation for an illumination period, holding the patterned surface and the UV-curable imprintable liquid medium together for a holding period such that the UV-curable medium has formed a self-supporting patterned layer, and separating the patterned surface and the patterned layer at the end of the holding period. The start time of the illumination period is earlier than the end time of the filling period by a pre-cure period. Also, a method is disclosed where the end time of the illumination period is earlier than the end time of the holding period.

20 Claims, 3 Drawing Sheets

OTHER PUBLICATIONS

Jan Haisma et al., "Mold-assisted nanolithography: A process for reliable pattern replication,", J. Vac. Sci. Technol. B 14(6), Nov./Dec. 1996, pp. 4124-4128.

Long et al., "Materials for step and flash imprint lithography," Journal of Materials Chemistry, vol. 17, No. 34, Sep. 14, 2007, pp. 3575-3580.

Kim et al., "Vinyl ether formulations for step and flash imprint lithography," J. Vac. Sci. Technol. B 23(6), Nov./Dec. 2005, pp. 2967-2971.

Michael D. Dickey et al., "Study of Kinetics of Step and Flash Imprint Lithography Photopolymerization," AIChE Journal, Sep. 2005, vol. 51, No. 9, pp. 2547-2555.

Michael D. Dickey et al., "Kinetic Parameters for Step and Flash Imprint Lithography Pholopolymerization," AIChE Journal, Feb. 2006, vol. 52, No. 2, pp. 777-784.

C. Decker et al., "Photoinitiated polymerization of vinyl ether-based systems," Progress in Organic Coatings, 2001, 42, pp. 253-266.

* cited by examiner

Time

Time

IMPRINT LITHOGRAPHY APPARATUS AND METHOD

This application claims priority and benefit under 35 U.S.C. §119(e) to U.S. Provisional Patent Application No. 61/233,992, entitled "Imprint Lithography Apparatus and Method", filed on Aug. 14, 2009. The content of that application is incorporated herein in its entirety by reference.

FIELD

The present invention relates to UV imprint lithography apparatus and methods for manufacture of devices.

BACKGROUND

In lithography, there is an ongoing desire to reduce the size of features in a lithographic pattern in order to increase the density of features on a given substrate area. In photolithography, the push for smaller features has resulted in the development of technologies such as immersion lithography and extreme ultraviolet (EUV) lithography, which are however rather costly.

A potentially less costly road to smaller features that has gained increasing interest is so-called imprint lithography, which generally involves the use of a "stamp" (often referred to as an imprint template) to transfer a pattern onto a substrate. An advantage of imprint lithography is that the resolution of the features is not limited by, for example, the emission wavelength of a radiation source or the numerical aperture of a projection system. Instead, the resolution is mainly limited to the pattern density on the imprint template.

Imprint lithography involves the patterning of an imprintable medium on a surface of a substrate to be patterned. The patterning may involve contacting a patterned surface of an imprint template with a layer of imprintable medium such that the imprintable medium flows into recesses in the patterned surface and is pushed aside by protrusions on the patterned surface. The recesses define pattern features of the patterned surface of the imprint template. Typically, the imprintable medium is flowable as the patterned surface and the imprintable medium contact each other. Following patterning of the imprintable medium, the imprintable medium is suitably brought into a non-flowable or frozen state and the patterned surface of the imprint template and the patterned imprintable medium are separated. The substrate and patterned imprintable medium are then typically processed further in order to pattern or further pattern the substrate. The imprintable medium is typically formed from imprintable medium droplets on the surface of a substrate to be patterned.

SUMMARY

UV-imprint lithography, particularly, Step and Flash Imprint Lithography (SFIL), typically involves the dispensing of an array of droplets of a UV-curable imprintable liquid medium, such as a UV-curable photoresist, for instance, onto a substrate, followed by alignment of a patterned surface of an imprint template with the array of droplets, or alignment of a patterned surface of an imprint template with the substrate, and bringing the patterned surface and the substrate together (e.g., by moving the patterned surface toward the substrate, moving the substrate toward the patterned surface, or both moving the patterned surface and substrate toward each other) so that the patterned surface of the imprint template contacts the droplets. As the patterned surface and the substrate are brought together, the droplets may spread out and flow to substantially fill recesses in the patterned surface. The UV-curable imprintable liquid medium is typically subsequently cured, with the imprint template and substrate held together for a holding period, with the UV-curable imprintable medium sandwiched between them. UV-irradiation is typically directed through the imprint template, which is adapted to be transparent or translucent to UV-radiation, onto the UV-curable medium. For instance the imprint template may be of a material such as quartz. Once the UV-curable imprintable liquid medium has cured sufficiently such that the resulting patterned layer of cured medium is self-supporting, then the imprint template becomes separated from the substrate and the resulting patterned layer (e.g., by moving the patterned surface away from the substrate, moving the substrate away from the patterned surface, or both moving the patterned surface and substrate away from each other). By "self-supporting" it is meant that the patterned layer is of sufficiently high viscosity or sufficiently gelled or solidified or hardened to maintain the imprinted shape of the patterned surface once the imprint template is separated from the patterned layer. The imprint template may then be used to imprint other substrates, or other parts of the same substrate, and the process repeated. The pattern in the cured layer may be transferred to the underlying substrate by a conventional etch technique such as commonly used, for instance, in optical lithography.

Low throughput rate, compared to other lithography techniques, such as optical lithography, may be a problem for imprint lithography methods such as SFIL. The time taken for the droplets of UV-curable imprintable liquid medium to flow into the recesses of the patterned surface on an imprint template, such that the recesses are substantially filled, is one of the most time-consuming steps of the overall process typically in excess of 2 seconds. Because of the time taken for the UV-curable imprintable liquid medium to flow into recesses to substantially fill them, the viscosity of the UV-curable imprintable liquid medium should be as low as possible to encourage flow. Curing of the UV-curable imprintable liquid medium into a self-supporting patterned layer commences in known UV imprint lithography methods after the recesses of the patterned surface have been filled. This is so that the viscosity of the UV-curable imprintable liquid medium is not increased until the recesses of the patterned surface are sufficiently filled. Any increase in viscosity could potentially lead to a longer filling period for the recesses, increasing overall process time. Typically, the holding step, during which curing typically occurs, requires a further 0.5 to 1 seconds, and so also makes a significant contribution to total process time.

The duration of the holding period may potentially be reduced by use of higher UV-irradiation power, but this may lead to one or problems associated with heating of the imprint template, imprintable medium and/or substrate, such as stresses and distortions arising from thermal expansion.

Accordingly, it is desirable to, for example, to provide an imprint lithography method and apparatus that allows for more rapid separation of a patterned surface of imprint template and a patterned layer on a substrate formed by UV-imprint lithography, particularly by SFIL, in order to increase process throughput. Accordingly, it is desirable to, for example, to provide an imprint lithography method and apparatus that enables the duration of the holding period to be reduced. Accordingly, it is desirable to, for example, to provide an imprint lithography method and apparatus which does not require substantial modifications to the physical features and characteristics of the UV-imprint lithography apparatus, such that an embodiment of the invention may be put into effect by minor modifications to an existing UV imprint lithography apparatus.

In an aspect, there is provided an imprint lithography method for forming a patterned layer from a UV-curable, imprintable liquid medium on a substrate by means of an imprint template having a patterned surface comprising recesses, the method comprising:

bringing together the patterned surface and the UV-curable imprintable liquid medium as an uncured, flowable liquid for a filling period having a start time when the patterned surface first contacts the UV-curable imprintable liquid medium and an end time when the UV-curable imprintable liquid medium has substantially filled the recesses in the patterned surface;

illuminating the UV-curable imprintable liquid medium with UV-radiation for an illumination period having a start time and an end time;

holding the patterned surface and the UV-curable imprintable liquid medium together for a holding period having a start time and an end time, the start time of the holding period commencing at the end time of the filling period and the end time of the holding period selected to provide adequate curing of the UV-curable imprintable liquid medium to form a self-supporting patterned layer; and separating the patterned surface and the patterned layer at the end time of the holding period, wherein the start time of the illumination period is earlier than the end time of the filling period by a pre-cure period.

The following features are applicable to all the various embodiments and aspects of any of the methods and apparatuses described herein where appropriate. When suitable, combinations of the following features may be employed as part of any of the methods and apparatuses described herein, for instance as set out in the claims. An embodiment of a method and apparatus of the invention is particularly suitable for step and flash imprint lithography (SFIL).

In an embodiment, the UV-curable imprintable liquid medium exhibits an inhibition period during which it has a viscosity which remains substantially unchanged (i.e. the viscosity does not increase by more than 10% during the inhibition period) following the start of the illumination period and wherein the pre-cure period is shorter than the inhibition period.

The start time of the illumination period may be earlier than the start time of the filling period. This may be the case when the inhibition period for the UV-curable imprintable liquid medium is longer than the total required filling time. In this case, the start of the illumination period may precede the contacting of the patterned surface of the imprint template with the droplets of UV-curable imprintable liquid medium, for instance during the alignment or bringing together of the imprint template and substrate.

In an embodiment, the end time of the holding period is selected to provide a substantially solid self-supporting patterned layer prior to separating the patterned surface and the patterned layer. By "self-supporting" it is meant that the UV-curable imprintable liquid medium has cured to a sufficiently high viscosity, at the end of the setting period, such that it maintains its shape for, for example, further curing after separating the patterned surface and the imprintable medium. The imprintable medium may be hardened to a solid self-supporting layer prior to separating the patterned surface and the imprintable medium.

The end time of the illumination period may be earlier than the end time of the holding period. This is suitable when the UV-curable imprintable liquid medium is one which continues to cure after UV-illumination has ended. The UV-curable imprintable liquid medium may be a medium wherein curing is initiated by UV illumination and continues after UV illumination has terminated.

The UV-curable imprintable liquid medium may be, for instance, an acrylate resist. An acrylate, such as a silicon-containing acrylate, is a suitable monomer for use in the UV-curable imprintable liquid medium. This type of monomer is thought to cure via a radical polymerization route (Long et al, J. Mater. Chem., 2007, 17, 3575). Radicals are formed by UV illumination of radical initiators present in the resist formulation.

The UV-curable imprintable liquid medium may be a medium which cures by means of a reaction catalyzed by UV-generated catalyst. For instance, the UV-curable imprintable liquid medium may be a vinyl ether UV photoresist. A vinyl ether monomer, particularly a monomer including silicone groups, are of use in an embodiment of the invention (Kim et al, J. Vac Sci Tech B, 2005, 23, 2967). The polymerization of such a vinyl ether is thought to be initiated by acid, and a photo-acid generator (PAG) that forms protons upon UV-illumination may be used as initiator molecules.

The UV-radiation may have a power which varies over the illumination period. In other words, the UV power may be varied over the illumination period. This change may be a step change or may be a gradual change. As used herein, the terms "gradual" or "gradually" means continuously and without step changes, for instance without changes of more than 10% in power over 0.05 seconds.

For instance, the UV-illumination power may decrease gradually from an initial value at the start time of the illumination period to a final value at the end time of the illumination period. By "initial value" is meant the stabilized value immediately after the start time of the illumination period and by "final value" is meant the stabilized value immediately after the end time of the illumination period. For instance, the final value of the power may be zero, meaning that the power is gradually lowered to a zero value by the end time of the illumination period.

The power may increase smoothly from an initial value at the start time to a maximum value. For instance, the initial value of the power may be zero. The power may increase gradually from the initial value to a maximum value, then decrease gradually from the maximum value to a final value at the end time of the illumination period. This final value, may, for example, be zero.

In an aspect, there is provided an imprint lithography method for forming a patterned layer from a UV-curable, imprintable liquid medium on a substrate by means of an imprint template having a patterned surface comprising recesses, the method comprising:

bringing together the patterned surface and the UV-curable imprintable liquid medium as an uncured, flowable liquid for a filling period having a start time when the patterned surface first contacts the UV-curable imprintable liquid medium and an end time when the UV-curable imprintable liquid medium has substantially filled the recesses in the patterned surface;

illuminating the UV-curable imprintable liquid medium with UV-radiation for an illumination period having a start time and an end time;

holding the patterned surface and the UV-curable imprintable liquid medium together for a holding period having a start time and an end time, the start time of the holding period commencing at the end time of the filling period and the end time of the holding period selected to provide adequate curing of the UV-curable imprintable liquid medium to form a self-supporting patterned layer; and separating the patterned surface and the patterned layer at the end time of the holding period, wherein the end time of the illumination period is earlier than the end time of the holding period.

The start time of the illumination period may be earlier than the end time of the filling period by a pre-cure period.

Other example suitable or desirable features are set out above.

In an aspect, there is provided an apparatus for imprint lithography of a substrate, the apparatus comprising an imprint template arrangement configured to bring together a patterned surface and a UV-curable imprintable liquid medium on a substrate to pattern the UV-curable imprintable liquid medium, a UV radiation outlet arranged to provide UV radiation to cure the UV-curable imprintable liquid medium, and a controller arranged to control operation of the apparatus, wherein the apparatus is adapted to:

bring together the patterned surface and the UV-curable imprintable liquid medium as an uncured, flowable liquid for a filling period having a start time when the patterned surface first contacts the UV-curable imprintable liquid medium and an end time when the UV-curable imprintable liquid medium has substantially filled the recesses in the patterned surface, illuminate the UV-curable imprintable liquid medium with UV-radiation from the UV radiation outlet for an illumination period having a start time and an end time, hold the patterned surface and the UV-curable imprintable liquid medium together for a holding period having a start time and an end time, the start time of the holding period commencing at the end time of the filling period and the end time of the holding period selected to provide adequate curing of the UV-curable imprintable liquid medium to form a self-supporting patterned layer, and separate the patterned surface and patterned layer at the end time of the holding period, wherein the controller is configured to operate the apparatus so that the start time of the illumination period is earlier than the end time of the filling period by a pre-cure period.

In an aspect, there is provided an apparatus for imprint lithography of a substrate, the apparatus comprising an imprint template arrangement configured to bring together a patterned surface and a UV-curable imprintable liquid medium on a substrate to pattern the UV-curable imprintable liquid medium, a UV radiation outlet arranged to provide UV radiation to cure the UV-curable imprintable liquid medium, and a controller arranged to control operation of the apparatus, wherein the apparatus is adapted to:

bring together the patterned surface and the UV-curable imprintable liquid medium as an uncured, flowable liquid for a filling period having a start time when the patterned surface first contacts the UV-curable imprintable liquid medium and an end time when the UV-curable imprintable liquid medium has substantially filled the recesses in the patterned surface, illuminate the UV-curable imprintable liquid medium with UV-radiation from the UV radiation outlet for an illumination period having a start time and an end time, hold the patterned surface and the UV-curable imprintable liquid medium together for a holding period having a start time and an end time, the start time of the holding period commencing at the end time of the filling period and the end time of the holding period selected to provide adequate curing of the UV-curable imprintable liquid medium to form a self-supporting patterned layer, and separate the patterned surface and patterned layer at the end time of the holding period, wherein the controller is configured to operate the apparatus so that the end time of the illumination period is earlier than the end time of the holding period.

In aspect, there may be separately provided the controllers of the apparatuses described above. For example, a controller configured to operate an imprint lithography apparatus so that the start time of the illumination period is earlier than the end time of the filling period by a pre-cure period, or a controller configured to operate an imprint lithography apparatus so that the end time of the illumination period is earlier than the end time of the holding period.

In an aspect, there is provided an imprint lithography method for forming a patterned layer from a UV-curable, imprintable liquid medium on a substrate by use of an imprint template having a patterned surface comprising recesses, the method comprising bringing together the patterned surface and the UV-curable imprintable liquid medium as an uncured, flowable liquid wherein the UV-curable imprintable liquid medium flows to substantially fill the recesses in the patterned surface, and illuminating the UV-curable imprintable liquid medium with UV-radiation commences before or during the bringing together the patterned surface and the UV-curable imprintable liquid.

The various features as set out above are also applicable, where appropriate, to the apparatus and controller embodiments described herein. When suitable, combinations of the features may be employed as part of the apparatus and controller, for instance as set out in the claims.

BRIEF DESCRIPTION OF THE DRAWINGS

Specific embodiments of the invention will be described with reference to the accompanying figures, in which.

DETAILED DESCRIPTION

Figure 1:
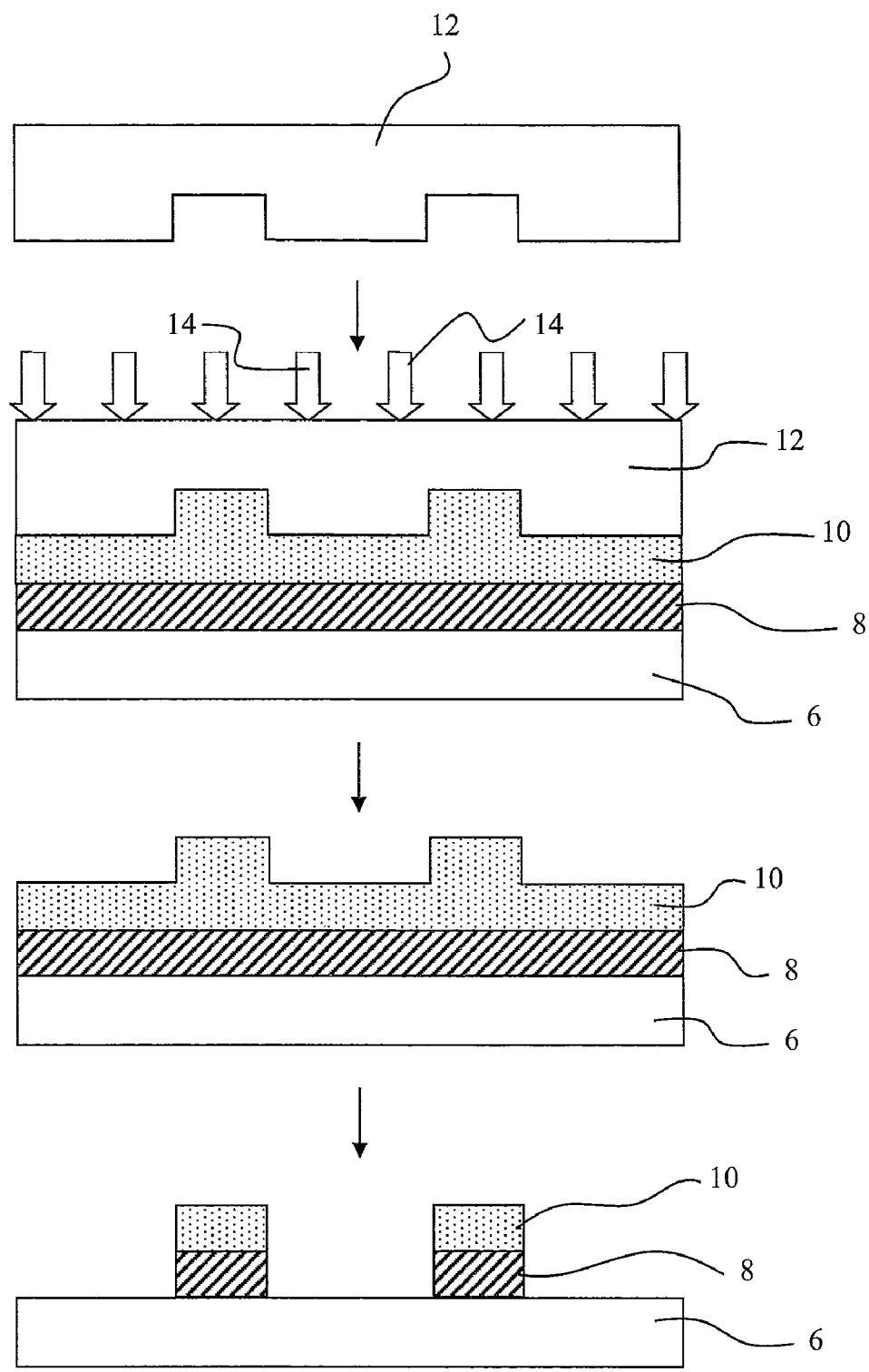
FIG. 1 schematically shows an example of UV-imprint lithography.

One example of an approach to UV-imprint lithography is schematically depicted in FIG. 1.

FIG. 1 shows an example of UV imprint lithography, which involves the use of a transparent or translucent template which is transmissive to UV and a UV-curable liquid as imprintable medium (the term "UV" is used herein for convenience but should be interpreted as including any suitable actinic radiation for curing the imprintable medium). A UV curable liquid is often less viscous than a thermosetting and thermoplastic resin used in hot imprint lithography and consequently may move much faster to fill template pattern features. A quartz template 12 with a patterned surface is applied to a UV-curable imprintable medium (e.g. resin) 10 on a substrate 6. Optionally, a planarization layer 8 may be provided between the substrate 6 and the imprintable medium 10. Instead of using heat or temperature cycling as in hot imprint lithography, the pattern is frozen by curing the imprintable medium 10 with UV radiation 14 that is applied through the quartz template 12 (having the patterned surface) onto the imprintable medium 10. After removal of the template 12, the imprintable medium 10 is etched. A particular manner of patterning a substrate through UV imprint lithography is so-called step and flash imprint lithography (SFIL), which may be used to pattern a substrate in small steps in a similar manner to optical steppers conventionally used in IC manufacture. For more information on UV imprint, see e.g. U.S. Patent Application Publication No. US 2004-0124566, U.S. Pat. No. 6,334,960, PCT Patent Application Publication No. WO 02/067055, and the article by J. Haisma entitled "Mold-assisted nanolithography: A process for reliable pattern replication", J. Vac. Sci. Technol. B14(6), November/December 1996.

Combination of the above imprint technique with hot imprint lithography is also possible. See, e.g., U.S. Patent Application Publication No. US 2005-0274693, which mentions a combination of heating and UV curing an imprintable medium.

Figure 2:
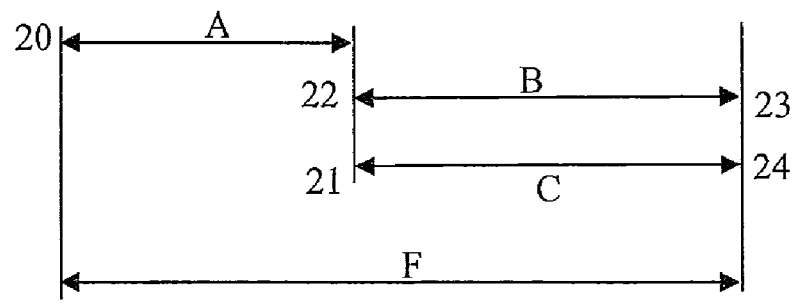
FIG. 2 schematically shows a process for carrying out UV-imprint lithography.

A conventional method for carrying out UV-imprint lithography is shown schematically in FIG. 2.

Droplets of UV-curable imprintable liquid medium 10 are provided on a substrate as an uncured, flowable liquid. Bringing the patterned surface of the imprint template 12 and the UV-curable imprintable liquid medium together for a filling period A commences at start time 20 when the patterned surface first contacts the UV-curable imprintable liquid medium and an end time 21 when the UV-curable imprintable liquid medium has substantially filled the recesses in the patterned surface.

Illumination of the UV-curable imprintable liquid medium with UV-radiation 14 takes place for an illumination period B having a start time 22, and an end time 23, with uniform irradiation power. The start time 22 of illumination period B commences at the end time 21 of the filling period A.

During the illumination period B, the patterned surface and the UV-curable imprintable liquid medium are held together for a holding period C having a start time 21 and an end time 24, the start time of the holding period commencing at the end time of the filling period and the end time of the holding period having the same end time as the illumination period B. In other words, the illumination period B and the holding period C occur simultaneously in this method.

At the end times of the illumination and holding periods, the patterned surface and the patterned layer are separated to leave a self-supporting patterned layer which is then processed further as required.

The total time from initial contact 20 of the patterned surface with the droplets to the separation 24 of imprint template and self-supporting patterned layer is denoted by overall period F.

Figure 3:
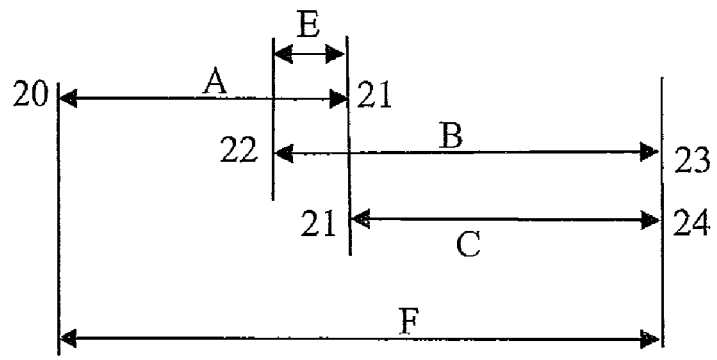
FIG. 3 schematically shows a method for carrying out UV-imprint lithography according to an embodiment of the invention, and FIG. 4 schematically shows a method for carrying out UV-imprint lithography according to an embodiment of the invention.

FIG. 3 schematically shows a method for carrying out UV-imprint lithography according to an embodiment of the invention.

Droplets of UV-curable imprintable liquid medium 10 are provided on a substrate as an uncured, flowable liquid. Pressing the patterned surface of the imprint template 12 and the UV-curable imprintable liquid medium together for a filling period A commences at start time 20 when the patterned surface first contacts the UV-curable imprintable liquid medium and an end time 21 when the UV-curable imprintable liquid medium has substantially filled the recesses in the patterned surface.

Illumination of the UV-curable imprintable liquid medium with UV-radiation 14 takes place for an illumination period B having a start time 22, and an end time 23, with uniform irradiation power. However, in this embodiment, the start time 22 of illumination period B commences before the end time 21 of the filling period A. The time difference between the start of the holding period C and the start of the illumination period B is represented by a pre-cure period E.

After the end time 21 of the filling period A, the patterned surface and the UV-curable imprintable liquid medium are held together for a holding period C having a start time 21 and an end time 24, the start time of the holding period commencing at the end time of the filling period and the end time of the holding period having the same end time as the illumination period. In other words, the illumination period B extends over part of the filling period A and over the entire holding period C.

At the end times of the illumination and holding periods, the patterned surface and the patterned layer are separated to leave a self-supporting patterned layer which is then processed further as required.

The UV-curable imprintable liquid medium used in this embodiment may be a medium which exhibits an inhibition period.

The holding period C for a UV-curable imprintable liquid medium may typically depend upon UV power, initiator type and concentration (where the UV-curable imprintable liquid medium includes a UV-activated initiator to cause polymerization), and upon the monomer of the UV-curable imprintable liquid medium.

UV-curable imprintable media used in UV-imprint lithography may exhibit UV curing that is initially inhibited, resulting in an undesired longer holding period C to allow adequate curing. For instance, acrylate-type resists suffer from oxygen inhibition. It has been demonstrated that oxygen dissolved in the resist formulation reacts with photo-generated radicals in an acrylate-initiator mixture (M. D. Dickey et al., AIChE J., 2005, 51, 2547 and M. D. Dickey et al., AIChE J., 2006, 52, 777). The radicals react with oxygen to form stable peroxy radicals, and this reaction is rapid compared to the polymerization reaction. It is thought that this causes a certain inhibition time before the desired polymerization reaction of an acrylate takes place. The inhibition time may depend, for instance, upon initiator concentration, oxygen concentration, and UV-radiation power (M. D. Dickey et al., AIChE J., 2005, 51, 2547). The inhibition time ranges from 0.5 s up to a few seconds.

Vinyl ether-type resists also suffer from inhibition times of the order of 1 to 2 seconds (C. Decker et al., Progr. Org. Coat. 2001, 42, 253). The underlying mechanism of the inhibition time in the case of an acid-catalyzed vinyl ether polymerization reaction is not well understood. It was suggested by Decker et al. that there is a short delay between the photolysis of the PAG (e.g. a sulfonium salt), and the actual production of protons.

The inhibition period observed in the polymerization reaction of both acrylates and vinyl ethers may limit throughput for UV-imprint lithography processes. An embodiment of the present invention provides a way to circumvent the delay caused by inhibition of the polymerization reaction. The viscosity (and other relevant physical properties) of the imprintable medium formulation do not change substantially during the inhibition period. In other words, the ability of the UV-curable imprintable liquid medium to flow into recesses of the patterned surface of an imprint template is not impaired during the inhibition period.

Hence, by commencing the illumination period B during the filling period A, it is possible to initiate the chemical processes which will eventually lead to curing of the UV-curable imprintable liquid medium without substantially affecting the filling of the recesses in the patterned surface of the template 12. It is desirable that the filling step should be completed (i.e. the recesses should be substantially filled by the UV-curable imprintable medium) before the inhibition period has elapsed. Following the end of the inhibition period, the viscosity of the UV-curable medium may increase rapidly, which would slow or prevent the flow of the UV-curable imprintable medium into the recesses of the patterned surface.

Because the illumination period B may be commenced some time E before the commencement of the holding period C, the overall period F from initial contact to release may be reduced without any loss in the ability of the UV-curable imprintable medium to substantially fill the recesses in the patterned surface, with the UV-illumination applied for the same length of period B and at the same power as for the method described with respect to FIG. 2.

Figure 4:
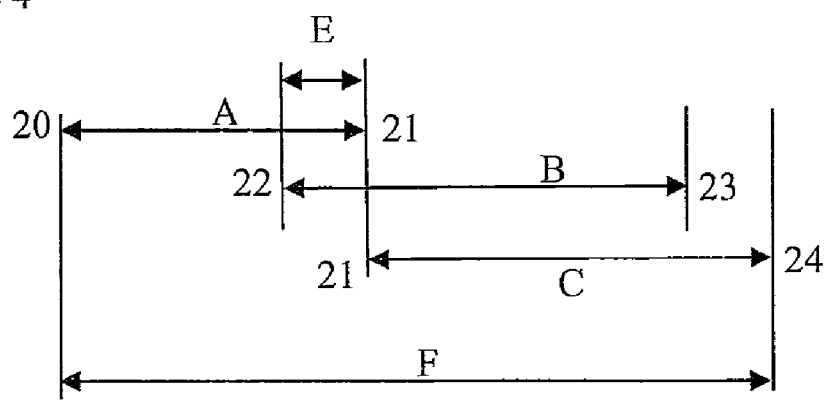

FIG. 4 schematically shows a method for carrying out UV-imprint lithography according to a further embodiment of the invention.

Droplets of UV-curable imprintable liquid medium 10 are provided on a substrate as an uncured, flowable liquid. Bringing together the patterned surface of the imprint template 12 and the UV-curable imprintable liquid medium for a filling period A commences at start time 20 when the patterned surface first contacts the UV-curable imprintable liquid medium and an end time 21 when the UV-curable imprintable liquid medium has substantially filled the recesses in the patterned surface.

Illumination of the UV-curable imprintable liquid medium with UV-radiation 14 takes place for an illumination period B having a start time 22 and an end time 23, with uniform irradiation power. As for the embodiment shown in FIG. 3, the start time 22 of illumination period B commences before the end time 21 of the filling period A. The time difference between the start of the holding period C and the start of the illumination period B is represented by a pre-cure period E. The end time 23 of the illumination period is before the end time 24 of the holding period C.

After the end time 21 of the filling period A, the patterned surface and the UV-curable imprintable liquid medium are held together for a holding period C having a start time 21 and an end time 24, the start time 21 of the holding period commencing at the end time 21 of the filling period and the end time 24 of the holding period being some time after the end time 23 of the illumination period B. In other words, the illumination period B extends over a later part of the filling period A and over an initial part of the holding period C.

At the end times of the illumination and holding periods, the patterned surface and the patterned layer are separated to leave a self-supporting patterned layer which is then processed further as required. For this embodiment, the overall process period F is the same as for the embodiment shown in FIG. 2. However, because the UV illumination has been switched off some time prior to the end of the holding period C; this gives time for any heat arising from the UV-illumination to be dissipated, leading to cooling of the substrate and patterned layer prior to separation at end time 24.

Although the rate of curing for UV-curable media may be increased by increasing the power of the UV-radiation used to cause curing, a high intensity of UV radiation may also lead to heating of the substrate. This may lead to a thermal expansion difference between a substrate and an imprint template and cause a problem for subsequent process steps, in particular potentially causing a problem in alignment on overlay of subsequent patterns. Hence, the embodiment of the invention shown in FIG. 4 may reduce such thermally-induced problems without increase in overall period F.

Once the inhibition period for a particular UV-curable medium has been established, the optimal timing for the UV-illumination period B to start 22 may be established. It may be advantageous to use a reduced UV power during the inhibition period in order to lengthen the inhibition time. This potentially provides a route to control the overlap between the filling period A and holding period C. In the case where a reduced UV power is used, or where a very short filling period is desired, the inhibition period may be longer than the filling period. In such a case it may be favorable to start 22 the illumination period B before the start 20 of the filling period A. For instance the start of the illumination period may precede the contacting of the patterned surface of the imprint template with the droplets of UV-curable imprintable liquid medium, for instance during the alignment or bringing together of the imprint template and medium.

For some UV-curable imprintable liquid media, such as vinyl ethers, curing is effected by a UV-generated catalyst. Once the catalyst has been generated by UV illumination, the polymerization reaction leading to curing will continue even in the absence of continued UV illumination. This means that continuous UV illumination is not required for such UV-curable media. For instance, a vinyl ether resist will continue to "cure in the dark" after initial UV illumination. This provides the opportunity to achieve curing with a high power dose of UV illumination for a short period B, with the illumination period B ending some time before the end of the holding period C. This means that there will be a period during which UV illumination is absent, during which cooling may occur, following any heating effects arising from the initial UV illumination. This may allow for sufficient cooling prior to separation of the imprint template and patterned layer to reduce a problem arising from undesired thermal expansion effects.

The use of non-uniform UV illumination power during the illumination period B may be advantageous for reducing the thermal impact of the UV illumination step on alignment and overlay of any subsequent patterned layers. For instance, the UV illumination power may be gradually decreased from an initial high power to a final low power during the illumination period B, or may, for instance, be gradually increased to a maximum value then gradually decreased to zero at the end of the illumination period B.

An embodiment, not shown in the Figures, may, for instance, have the start time 22 of the illumination period B coinciding with the end time 21 of the filling period A, but with the end time 23 of the illumination period B earlier than the end time 24 of the holding period C.

An advantage of an embodiment of the invention is that no mechanical adaptations or modifications to an existing UV-imprint lithography apparatus is required to implement an embodiment of the present invention. A change in the timing at which the UV-illumination step takes place as described herein may be effected by modifications to the software control of the apparatus.

The present invention relates to imprint lithography apparatus and methods. The apparatus and/or methods may be used for the manufacture of devices, such as electronic devices and integrated circuits or other applications, such as the manufacture of integrated optical systems, guidance and detection patterns for magnetic domain memories, flat-panel displays, liquid-crystal displays (LCDs), thin film magnetic heads, organic light emitting diodes, etc. In particular, the methods and apparatus are suitable for high resolution lithography, where features patterned onto a substrate have a feature width or critical dimension of about 1 μm or less, typically 100 nm or less or even 10 nm or less.

Lithography may involve applying several patterns onto a substrate, the patterns being stacked on top of one another such that together they form a device such as an integrated circuit. Alignment of each pattern with a previously provided pattern is an important consideration. If patterns are not aligned with each other sufficiently accurately, then this may result in some electrical connections between layers not being made. This, in turn, may cause a device to be non-functional. A lithographic apparatus therefore usually includes an alignment apparatus, which may be used to align each pattern with a previously provided pattern, and/or with alignment marks provided on the substrate.

Typically, the substrate is clamped to a substrate holder. Typically, the substrate holder is moveable with respect to the imprint template(s), the imprint template(s) is moveable with respect to the substrate holder, or both, between imprints. Generally, a control system, such as a computer running a computer program, uses information from the alignment apparatus to control the relative positioning of the substrate and the imprint template(s) as each pattern is imprinted.

In the above embodiments, a single imprint template, a single imprint template holder, a single substrate holder and a single substrate is provided in a single chamber. In other embodiments, more than one imprint template, more than one imprint template holder, more than one substrate holder, and/or more than one substrate may be provided in one or more chambers, in order for imprints to be undertaken more efficiently or quickly (e.g. in parallel). For example, in an embodiment, there is provided an apparatus that includes a plurality (e.g. 2, 3, or 4) of substrate holders. In an embodiment, there is provided an apparatus that includes a plurality (e.g. 2, 3, or 4) of imprint template arrangements (i.e., an imprint template holder and/or an imprint template). In an embodiment, there is provided an apparatus configured to use one imprint template arrangement per substrate holder. In an embodiment, there is provided an apparatus configured to use more than one imprint template arrangement per substrate holder. In an embodiment, there is provided an apparatus that includes a plurality (e.g. 2, 3, or 4) of imprintable medium dispensers. In an embodiment, there is provided an apparatus configured to use one imprintable medium dispenser per substrate holder. In an embodiment, there is provided an apparatus configured to use one imprintable medium dispenser per imprint template arrangement. In an embodiment, where an apparatus is provided that includes a plurality of substrate holders, the substrate holders may share functionalities in the apparatus. For instance, the substrate holders may share a substrate handler, a substrate cassette, a gas supply system (e.g. to create a helium environment during imprinting), an imprint medium dispenser, and/or a radiation outlet (for curing the imprintable medium). In an embodiment, two or more of the substrate holders (e.g. 3 or 4) share one or more functionalities of the apparatus (e.g. 1, 2, 3, 4, or 5 functionalities). In an embodiment, one or more functionalities (e.g. 1, 2, 3, 4, or 5) of the apparatus are shared among all substrate holders.

In order to aid release of the patterned surface from the imprintable medium after patterning, the patterned surface may comprise a release layer comprising or consisting essentially of titania, alumina, tantalum oxide or mixtures thereof, or may comprise an organic release layer.

The imprintable medium may be hardened by actinic radiation, such as UV radiation, applied through the imprint template. In order to facilitate this, the imprint template may comprises a porous solid medium that is transmissive (i.e. transparent or translucent) to actinic radiation such as UV radiation. Silica is useful for this purpose.

In this specification, the term "substrate" is meant to include any surface layers forming part of the substrate, or being provided on another substrate, such as a planarization layer or an anti-reflection coating layer.

In this specification, the term "period" means a period of time having a certain length extending from a start time for the period to an end time for the period. One period may start as another ends so that the start time for the later period is said to be the same as the end time for the earlier period.

The invention claimed is:

1. An imprint lithography method for forming a patterned layer from a UV-curable, imprintable liquid medium on a substrate by means of an imprint template having a patterned surface comprising recesses, the method comprising:

bringing together the patterned surface and the UV-curable imprintable liquid medium as an uncured, flowable liquid for a filling period having a start time when the patterned surface first contacts the UV-curable imprintable liquid medium and an end time when the UV-curable imprintable liquid medium has substantially filled the recesses in the patterned surface;

illuminating the UV-curable imprintable liquid medium with UV-radiation for an illumination period having a start time and an end time;

holding the patterned surface and the UV-curable imprintable liquid medium together for a holding period having a start time and an end time, the start time of the holding period commencing at the end time of the filling period and the end time of the holding period selected to provide adequate curing of the UV-curable imprintable liquid medium to form a self-supporting patterned layer; and separating the patterned surface and the patterned layer at the end time of the holding period, wherein the start time of the illumination period is at or after the start time of the filling period and earlier than the end time of the filling period by a pre-cure period.

2. The method of claim 1 wherein the UV-curable imprintable liquid medium exhibits an inhibition period during which it has a viscosity which remains substantially unchanged following the start time of the illumination period and wherein the pre-cure period is shorter than the inhibition period.

3. The method of claim 1, wherein the end time of the holding period is selected to provide a substantially solid self-supporting patterned layer prior to separating the patterned surface and the patterned layer.

4. The method of claim 1, wherein the end time of the illumination period is earlier than the end time of the holding period.

5. The method of claim 1, wherein the UV-curable imprintable liquid medium is an acrylate resist or a vinyl ether resist.

6. The method of claim 1, wherein the UV-curable imprintable liquid medium is a medium wherein curing is initiated by UV illumination and continues after UV illumination has terminated.

7. The method of claim 1, wherein the UV-radiation has a power which varies over the illumination period.

8. The method of claim 7, wherein the power decreases gradually from an initial value at the start time of the illumination period to a final value at the end time of the illumination period.

9. The method of claim 7, wherein the power increases gradually from an initial value at the start time of the illumination period to a maximum value.

10. The method of claim 9, wherein the power increases gradually from the initial value to the maximum value, then decreases gradually from the maximum value to a final value at the end time of the illumination period.

11. An imprint lithography method for forming a patterned layer from a UV-curable, imprintable liquid medium on a substrate by means of an imprint template having a patterned surface comprising recesses, the method comprising:

bringing together the patterned surface and the UV-curable imprintable liquid medium as an uncured, flowable liquid for a filling period having a start time when the patterned surface first contacts the UV-curable imprintable liquid medium and an end time when the UV-curable imprintable liquid medium has substantially filled the recesses in the patterned surface;

illuminating the UV-curable imprintable liquid medium with UV-radiation for an illumination period having a start time and an end time;

holding the patterned surface and the UV-curable imprintable liquid medium together for a holding period having a start time and an end time, the start time of the holding period commencing at the end time of the filling period and the end time of the holding period selected to provide adequate curing of the UV-curable imprintable liquid medium to form a self-supporting patterned layer; and separating the patterned surface and the patterned layer at the end time of the holding period, wherein the start time of the illumination period is earlier than the end time of the filling period and the illuminating is continuous from the start time of the illumination period until the end time of the illumination period, the end time of the illumination period being later than or equal to the start time of the holding period and earlier than the end time of the holding period.

12. An imprint lithography method for forming a patterned layer from a UV-curable, imprintable liquid medium on a substrate by use of an imprint template having a patterned surface comprising recesses, the method comprising:

bringing together the patterned surface and the UV-curable imprintable liquid medium as an uncured, flowable liquid wherein the UV-curable imprintable liquid medium flows to substantially fill the recesses in the patterned surface; and illuminating the UV-curable imprintable liquid medium with UV-radiation, the illuminating commences during the bringing together the patterned surface and the UV-curable imprintable liquid medium at a time at or after the time when the patterned surface first contacts the UV-curable imprintable liquid medium and at or before a time when the UV-curable imprintable liquid medium has substantially filled the recesses in the patterned surface.

13. The method of claim 12, wherein the UV-curable imprintable liquid medium exhibits an inhibition period during which it has a viscosity which remains substantially unchanged following commencement of the illuminating and wherein the time between the commencing of the illuminating and when the UV-curable imprintable liquid medium has substantially filled the recesses in the patterned surface is shorter than the inhibition period.

14. The method of claim 12, wherein a holding period commences at the time when the UV-curable imprintable liquid medium has substantially filled the recesses in the patterned surface and ends when there is adequate curing of the UV-curable imprintable liquid medium to form a self-supporting patterned layer and the end of the illuminating is earlier than the end of the holding period.

15. The method of claim 12, wherein the UV-curable imprintable liquid medium is a medium wherein curing is initiated by UV illumination and continues after UV illumination has terminated.

16. The method of claim 12, wherein the UV-radiation has a power which varies over the illuminating.

17. The method of claim 16, wherein the power decreases gradually from an initial value at the start of the illuminating to a final value at the end of the illuminating.

18. The method of claim 16, wherein the power increases gradually from an initial value at the start of the illuminating to a maximum value.

19. The method of claim 18, wherein the power increases gradually from the initial value to the maximum value, then decreases gradually from the maximum value to a final value at the end of the illuminating.

20. The method of claim 11, wherein the UV-curable imprintable liquid medium exhibits an inhibition period during which it has a viscosity which remains substantially unchanged following commencement of the illumination period and wherein the time between the start time of the illumination period and the end time of the filling period is shorter than the inhibition period.

* * * * *